United States Patent [19]

Pelgrom

[11] Patent Number: 5,081,372
[45] Date of Patent: Jan. 14, 1992

[54] SAMPLE-AND-HOLD DEVICE

[75] Inventor: Marcellinus J. M. Pelgrom, Eindhoven, Netherlands

[73] Assignee: U.S. Philips Corporation, New York, N.Y.

[21] Appl. No.: 528,658

[22] Filed: May 24, 1990

[30] Foreign Application Priority Data

May 29, 1989 [NL] Netherlands .................. 8901354

[51] Int. Cl.⁵ .................................... G11C 27/02
[52] U.S. Cl. .................... 307/353; 307/359; 328/151
[58] Field of Search .......... 307/353, 359; 328/151, 328/127

[56] References Cited

U.S. PATENT DOCUMENTS

| | | | |
|---|---|---|---|
| 4,546,324 | 10/1985 | Bingham et al. | 307/353 |
| 4,672,239 | 6/1987 | Thommen | 307/353 |
| 4,691,125 | 9/1987 | Rybicki | 307/353 |
| 4,728,811 | 3/1988 | Iida et al. | 307/353 |

FOREIGN PATENT DOCUMENTS

| | | |
|---|---|---|
| 1931242 | 12/1970 | Fed. Rep. of Germany . |
| 1241289 | 6/1986 | U.S.S.R. .................. 307/353 |

Primary Examiner—John Zazworsky
Attorney, Agent, or Firm—Bernard Franzblau

[57] ABSTRACT

A sample-and-hold device provided with a series arrangement of a first and a second integrating circuit, each including an input, an output and a control signal input. The output of the first integrating circuit is coupled to the input of the second integrating circuit. A control unit supplies a first and a second control signal to the control signal inputs of the first and the second integrating circuit, respectively. The output of the second integrating circuit is fed back to the input of the first integrating circuit. The first integrating circuit is controlled by the first control signal in a manner such that in the first integrating circuit an integration step is performed upon the difference between the input voltage on the input of the first integrating circuit and the output voltage fed back from the output of the second integrating circuit. The second integrating circuit is controlled by the second control signal in a manner such that upon completion of the integration step in the first integrating circuit, an integration step is performed upon the output signal of the first integrating circuit.

This arrangement provides comparatively small signal variations at the inputs of the amplifier stages in the integrating circuits and thus reduces signal distortion.

16 Claims, 3 Drawing Sheets

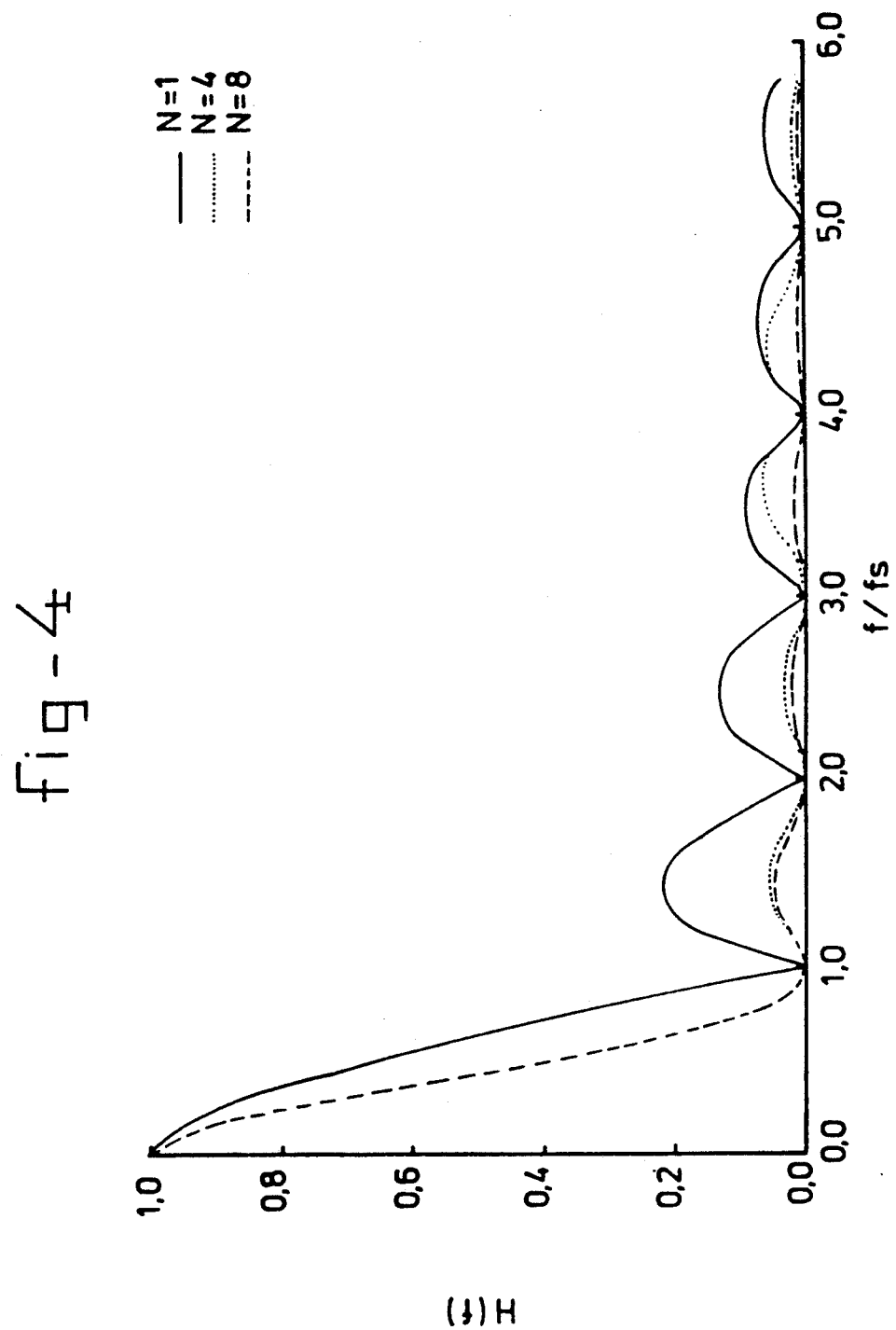

SAMPLE-AND-HOLD DEVICE

BACKGROUND OF THE INVENTION

This invention relates to a sample-and-hold device comprising
a series arrangement of a first and a second integrating circuit, each comprising an input, an output and a control signal input, the output of the first integrating circuit being coupled to the input of the second integrating circuit,
a control unit for supplying a first and a second control signal to a first and a second output respectively, which first and second output are coupled to the control signal input of the first and the second integrating circuit respectively, and for supplying the first and the second control signal to the first and the second integrating circuit respectively.

Such a sample-and-hold device is described in, for example, German Offenlegungsschrift 1,931,242. This prior-art device employs integrating circuits which should be capable of handling input signals which vary comparatively strongly.

In general, the integrating circuits in such a sample-and-hold device are realized by means of a buffer stage in combination with capacitive elements and switching means. If these buffer stages are required to handle input signals which may vary within a large range, as is the case in the above-mentioned German Offenlegungsschrift 1,931,242, this may generally give rise to a comparatively strong signal distortion. Moreover, in general the limited common-mode input range of the buffer stage will impose a limitation on the permissible signal swing. This applies in particular, though not exclusively, to CMOS circuits.

SUMMARY OF THE INVENTION

It is an object of the invention to provide a sample-and-hold device whose buffer stages are required to handle only comparatively small signal variations.

In a sample-and-hold device of the type defined in the opening paragraph this object is achieved in that
the output of the second integrating circuit is fed back to the input of the first integrating circuit,
the first integrating circuit is controlled by said first control signal in a manner such that in said first integrating circuit an integration step is performed upon the difference between the input voltage at the input of the first integrating circuit and the output voltage fed back from the output of the second integrating circuit, and
the second integrating circuit is controlled by said second control signal in a manner such that in said second integrating circuit, upon completion of the integration step in the first integrating circuit, an integration step is performed upon the output signal of the first integrating circuit.

The difference between the input voltage to be sampled on the input of the first integrating circuit and the output voltage fed back from the output of the second integrating circuit will generally be comparatively small, in particular if the analog input signals to be sampled are continuous.

Preferably, the sample-and-hold device in accordance with the invention is constructed in such a way that the second control signal controls the second integrating circuit in such a manner that the integration step performed in the second integrating circuit is divided into a number of N successive sub-integration steps, each performed upon the output voltage of the first integrating circuit.

When a comparatively large value is selected for N, this results in an effective upper band suppression in the output signal of the sample-and-hold device. Preferably, N is selected to be larger than or equal to 8.

Moreover, it is preferred to select the ratios between the capacitive elements in the first and the second integrating circuit and the number of N successive subintegration steps in such a manner that the overall gain factor of the sample-and-hold device is unity.

In an embodiment of the invention each of the integrating circuits is constructed as a switched-capacitance integrator, comprising an amplifier stage having an inverting input, a non-inverting input and an output, a capacitor coupled between the inverting input and the output, and a capacitor network comprising at least one switching element and coupled between the input of the integrator and the inverting input of the amplifier stage. This capacitor network has a control signal input for receiving one of said control signals to cause said at least one switching element to be changed over under the influence of the control signal, the capacitor network associated with the first integrating circuit being constructed in such a manner that in said first integrating circuit the difference is formed between the signal to be sampled and the signal fed back from the output of the second integrating circuit. Preferably, the non-inverting inputs of the amplifier stages in the integrating circuits are then connected to a reference voltage, preferably ground. In this way the input signal swing remains comparatively small, thereby eliminating possible limitations caused by the limited common-mode input range of the amplifier stages.

BRIEF DESCRIPTION OF THE DRAWINGS

The invention will now be described in more detail with reference to the accompanying drawing in which.

FIG. 4 illustrates the frequency response of the sample-and-hold device for different values of N, i.e. the number of sub-integrations performed in every complete integration step in the second integrating circuit.

DESCRIPTION OF THE PREFERRED EMBODIMENTS

Figure 1:
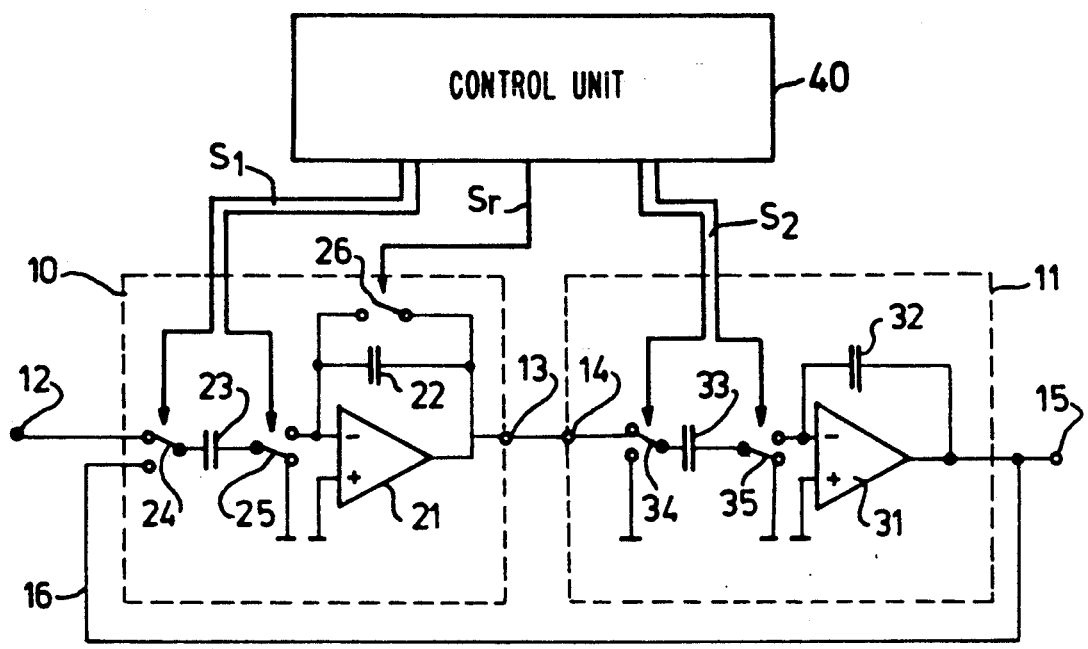
FIG. 1 shows an embodiment of a sample-and-hold circuit in accordance with the invention.

FIG. 1 shows an embodiment of a sample-and-hold device in accordance with the invention. The device comprises a first integrating circuit 10, a second integrating circuit 11, and a control unit 40. The output 13 of the first integrating circuit 10 is connected to the input 14 of the second integrating circuit 11. The output voltage at the output 15 of the second integrating circuit 11 is fed back to the input side of the first integrating circuit 10 via the feedback line 16 in order to reduce the input signal swing in the stage 10 in a manner to be described hereinafter.

The first integrating circuit 10 comprises an operational amplifier 21 whose non-inverting input is connected to a reference voltage, in the present case ground. The output of the operational amplifier 21 is fed back to the inverting input via a capacitor 22. A reset switch 26 is arranged in parallel with this capacitor 22. A switch 24, a capacitor 23 and a switch 25 are arranged in series between the input 12 of the integrating circuit 10 and the inverting input of the operational amplifier 21. The switch 24 can connect one terminal of the capacitor 23 either to the input 12 or to the feedback line 16. By means of the switch 25 the other terminal of the capacitor can be connected to the reference voltage, in the present case ground, or to the inverting input of the operational amplifier 21.

Similarly, the second integrating circuit 11 comprises an operational amplifier 31 whose output is fed back to the inverting input via a capacitor 32. Moreover, a switch 34, a capacitor 33 and a switch 35 are arranged in series between the input 14 of the circuit 11 and the inverting input of the operational amplifier 31. By means of the switch 34 one terminal of the capacitor 33 can be connected either to the input 14 of the circuit 11 or to a reference level, in the present case ground. The switch 35 can connect the other terminal of the capacitor 33 either to the inverting input of the operational amplifier 31 or to a reference voltage, in the present case ground.

The switches 24, 25, 26, 34 and 35 are controlled by the control unit 40, which supplies suitable control signals to these switches via the lines $S_1$, $S_r$ and $S_2$.

Figure 2:
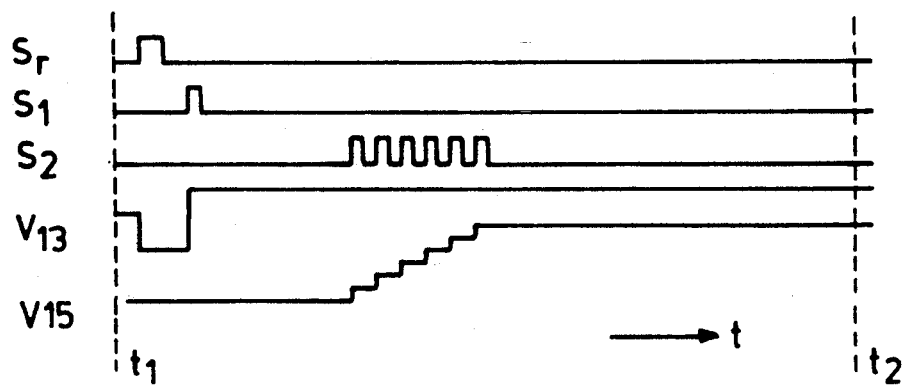
FIG. 2, in order to explain the operation of the device shown in FIG. 1, shows some signal waveforms which can appear on various points in the device shown in FIG. 1.

FIG. 2 shows some signal waveforms to illustrate the operation of the circuit shown in FIG. 1. FIG. 2, by way of example, shows only those signal waveforms which can appear within a sampling interval between the instant $t_1$ and the instant $t_2$.

At the beginning of a sampling interval a reset signal comprising a single pulse is applied to the switch 26 via the line $S_r$. This causes the capacitor 22 to discharge and the first integrating circuit 10 to be set to a well-defined initial state. As a result of this, the voltage $V_{13}$ on the output 13 of the first integrating circuit 10 goes to the 0 level (or to a specific reference level depending upon the voltage on the + input of the amplifier 21), as is illustrated in FIG. 2.

Subsequently, at an instant after the appearance of the reset pulse a switching pulse is applied to the switches 24 and 25 via the control lines $S_1$. Prior to this pulse the input signal level to be sampled already appears on the input 12 and at the instant at which the pulse $S_1$ appears the capacitor 23 has been charged, via the switches 24 and 25, to the signal level to be sampled. The switches 24 and 25 are now changed over by means of the pulse $S_1$, as a result of which a voltage is applied to the inverting input of the operational amplifier 21, which voltage is equal to the difference between the voltage on the capacitor 23 (the input voltage to be sampled) and the output voltage appearing on the output 15 of the second integrating circuit. This difference signal is integrated by means of the amplifier 21 and the capacitor 22 and results in a specific output voltage $V_{13}$ on the output 13 of the first integrating circuit. The exact value of this voltage $V_{13}$ depends on, inter alia, the ratio between the capacitance values of the capacitors 22 and 23, as will be explained hereinafter.

The output voltage on the output 13 is applied to the input 14 and is used primarily for charging the capacitor 33 via the switches 34 and 35. A control signal is applied to the switches 34 and 35 via the lines $S_2$, which control signal may be constituted by a single pulse or a series of pulses. By way of example FIG. 2 shows a control signal on the line $S_2$. This signal comprises six consecutive pulses each of which change over the switches 34, 35. It will be evident that this results in the voltage on the input 14 being integrated six times in succession through charge reversal of the capacitor 33, causing the voltage $V_{15}$ on the output 15 to increase in six steps to a specific final value. This final value depends not only on the value of the voltage on the input 14, but also on the ratio between the capacitance values of the capacitors 32 and 33.

If it is assumed that the variation in the analog input signal on the input 12 between the sampling instants is comparatively small, which is definitely so if the sample of an analog input signal is dimensioned correctly, the input signal swing of the operational amplifier 21 need only be comparatively small. The output signal of this operational amplifier, applied to the input 14 of the second integrating circuit 11 via the output 13, will be comparatively small so that the operational amplifier 31 also requires only a comparatively small input signal swing. This is in particular so if in the first integrating circuit a relative attenuation and in the second integrating circuit a relative amplification is obtained depending on the dimensioning of the circuit, as will be set forth hereinafter. This is a substantial advantage especially if the device shown in FIG. 1 is realised in CMOS technology. The use of a number of pulses in the signal $S_2$ within a sampling interval yields advantages in particular with respect to the suppression of upper harmonics, as will be explained with reference to FIGS. 3 and 4.

Figure 3A:
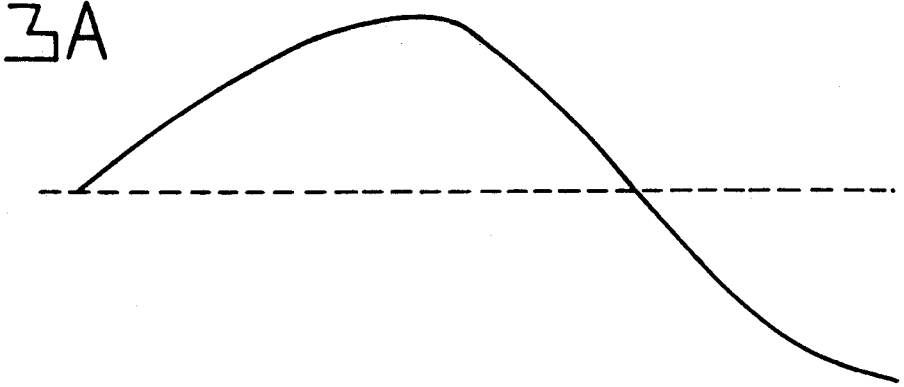
FIGS. 3a–3c show in greater detail signal waveforms appearing when a varying analog input signal is sampled.
Figure 3B:
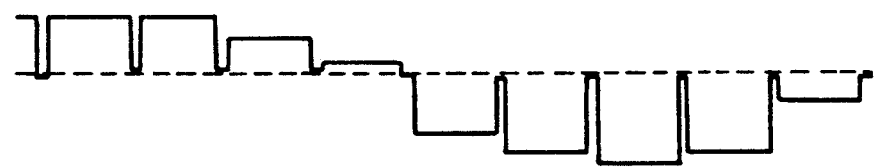
Figure 3C:
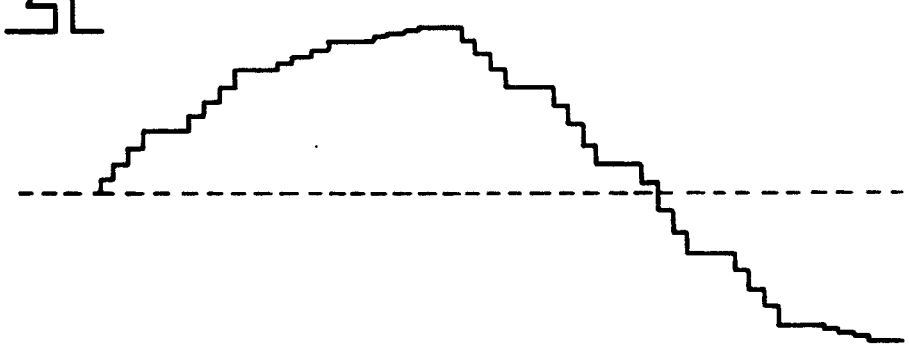

FIGS. 3a–3c show waveforms appearing on the input 12, the input 14 and the output 15 in the device shown in FIG. 1, the signal shown in FIG. 3a being applied to the input 12. The signal in FIG. 3a is a continuously varying analog signal. Each time that the signal is sampled by the first integrating circuit 10, as set forth hereinbefore, it has to handle only the difference between the instantaneous value of the input signal on the input 12 and the value generated in the meantime on the output 15 of the device. FIG. 3b shows the signal waveform of the voltage on the output 13 of the first integrating circuit 10. After every reset pulse, which briefly resets the output 13 to zero, an output voltage will occur whose value depends on the instantaneous steepness of the analog signal on the input 12. The voltage on the output 13 between the reset pulses each time increases as the signal varies more steeply. The voltage steps in the signal shown in FIG. 3b are transferred to the second integrating circuit 11 via the input 14 for further processing. If this circuit each time transfers control signals in the form of four pulses to the switches 34 and 35 via the line $S_2$, a transition from an initial signal level to a final signal level will be realised in four steps within every sampling interval. The output voltage on the output 15, illustrated in FIG. 3c, will therefore have a somewhat smoother shape, which more closely matches the analog signal waveform in FIG. 3a. The effect of this stepwise integration in the second integrating circuit 11 is, in particular, a suppression of the upper harmonics, as will be apparent from the frequency-response curve shown in FIG. 4.

FIG. 4 gives the frequency response H(f) as a function of the normalised frequency $f/f_s$, where $f_s$ is the sampling rate. FIG. 4 gives the frequency response for three different values of N, i.e. for N=1, N=4 and N=8. The curves show that as the value of N increases an effective suppression of upper harmonics is obtained. Therefore, the circuit shown in FIG. 1 should preferably employ a control unit which supplies a comparatively large number of pulses within every sampling interval. This number of pulses should be selected in conformity with the dimensioning of, in particular, the capacitances used in the circuit shown in FIG. 1, as will be explained hereinafter.

The gain factor between the input 12 and the output 13 of the first integrating circuit 10 depends upon the ratio between the capacitance values of the capacitors 22 and 23, viz. C22/C23. Likewise, the ratio between the signal values on the input 14 and the output 15 of the second integrating circuit 11 depends upon the ratio between the capacitance values of the capacitors 32 and 33, viz. C32/C33. Since the second integrating stage performs N sub-integrations, this capacitance ratio should be multiplied by N in order to obtain the overall gain of the second stage. If, as is customary, unity signal gain is required for the entire device of FIG. 1 between the input 12 and the output 15, the following relationship must be valid:

$$N \cdot (C22/C23) \cdot (C32/C33) = 1.$$

If a unity gain factor is required and, in addition, a comparatively large value for N is preferred, the capacitance values C22, C23, C32 and C33 should be chosen accordingly.

If the value of N is not 1, it is preferable to divide the N pulses within every sampling interval as uniformly as possible over the entire sampling interval. This results in a comparatively smooth waveform of the sampled signal shown in FIG. 3c. However, in view of a satisfactory filter action (upper harmonics suppression) it may be preferred to divide the pulses nonuniformly and to situate them at deviating predetermined instants.

I claim:

1. A sample-and-hold device comprising:
   a series arrangement of a first and a second integrating circuit, each comprising an input, an output and a control signal input, the output of the first integrating circuit being coupled to the input of the second integrating circuit,
   a control unit comprising a first and a second output for supplying a first and a second control signal to the control signal input of the first and the second integrating circuit, respectively,
   wherein
   the output of the second integrating circuit is fed back to the input of the first integrating circuit,
   the first integrating circuit is controlled by said first control signal in a manner such that said first integrating circuit performs an integration step upon the difference between an input signal at the input of the first integrating circuit and an output signal fed back from the output of the second integrating circuit, and
   the second integrating circuit is controlled by said second control signal in a manner such that said second integrating circuit, upon completion of the integration step in the first integrating circuit, performs an integration step upon an output signal of the first integrating circuit.

2. A sample-and-hold device as claimed in claim 1, wherein the second control signal controls the second integrating circuit in a manner such that the integration step performed in the second integrating circuit is divided into a number of N successive sub-integration steps, each performed upon the output signal of the first integrating circuit.

3. A sample-and-hold device as claimed in claim 2, wherein N is selected to be larger than 4.

4. A sample-and-hold device as claimed in claim 2 or 3, wherein the N successive sub-integration steps are divided at least substantially uniformly over one complete sampling interval.

5. A sample-and-hold device as claimed in claim 2 wherein each of the integrating circuits comprises a switched-capacitance integrator, comprising an amplifier stage having an inverting input, a non-inverting input and an output, a first capacitor coupled between the inverting input and the output, and a capacitor network comprising at least one switching element and coupled between the input of the integrator and the inverting input of the amplifier stage, wherein the capacitor network has a control signal input for receiving one of said control signals to cause said at least one switching element to be changed over under the influence of the control signal, the capacitor network associated with the first integrating circuit being arranged so as to form in said first integrating circuit the difference between the signal to be sampled and the signal fed back from the output of the second integrating circuit.

6. A sample-and-hold device as claimed in claim 5, wherein the capacitor network associated with the first integrating circuit comprises a first switching element for switching one terminal of a second capacitor between the input signal to be sampled and the output signal fed back from the output of the second integrating circuit, and a second switching element for switching the other terminal of the second capacitor between a fixed reference level and the inverting input of the amplifier stage in the first integrating circuit.

7. A sample-and-hold device as claimed in claim 6, wherein a further switching element is corrected in parallel with the first capacitor associated with the first integrating circuit, which further switching element has a control signal input arranged to receive a reset signal prior to the integration process.

8. A sample-and-hold device as claimed in claim 6 wherein the non-inverting inputs of the amplifier stages in the integrating circuits are connected to a reference voltage.

9. A sample-and-hold device as claimed in claim 3 wherein the N successive sub-integration steps are divided at least substantially uniformly over one complete sampling interval.

10. A sample-and-hold device as claimed in claim 3 wherein each of the integrating circuits comprises a switched-capacitance integrator, comprising an amplifier stage having an inverting input, a non-inverting input and an output, a first capacitor coupled between the inverting input and the output, and a capacitor network comprising at least one switching element and coupled between the input of the integrator and the inverting input of the amplifier stage, wherein the capacitor network has a control signal input for receiving one of said control signals to cause said at least one switching element to be changed over under the influence of the control signal, the capacitor network associated with the first integrating circuit being arranged so as to form in said first integrating circuit the difference between the signal to be sampled and the signal fed back from the output of the second integrating circuit.

11. A sample-and-hold device as claimed in claim 10, wherein the capacitor network associated with the first integrating circuit comprises a first switching element for switching one terminal of a second capacitor between the input signal to be sampled and the output signal fed back from the output of the second integrating circuit, and a second switching element for switching the other terminal of the second capacitor between a fixed reference level and the inverting input of the amplifier stage in the first integrating circuit.

12. A sample-and-hold device as claimed in claim 1 wherein each of the integrating circuits comprises a switched-capacitance integrator, comprising an amplifier stage having an inverting input, a non-inverting input and an output, a first capacitor coupled between the inverting input and the output, and a capacitor network comprising at least one switching element and coupled between the input of the integrator and the inverting input of the amplifier stage, wherein the capacitor network has a control signal input for receiving one of said control signals to cause said at least one switching element to be changed over under the influence of the control signal, the capacitor network associated with the first integrating circuit being arranged so as to form in said first integrating circuit the difference between the signal to be sampled and the signal fed back from the output of the second integrating circuit.

13. A sample-and-hold device as claimed in claim 12, wherein the capacitor network associated with the first integrating circuit comprises a first switching element for switching one terminal of a second capacitor between the input signal to be sampled and the output signal fed back from the output of the second integrating circuit, and a second switching element for switching the other terminal of the second capacitor between a fixed reference level and the inverting input of the amplifier stage in the first integrating circuit.

14. A sample-and-hold device as claimed in claim 12 wherein a further switching element is connected in parallel with the first capacitor associated with the first integrating circuit, which further switching element has a control signal input arranged to receive a reset signal prior to the integration process.

15. A sample-and-hold device as claimed in claim 2 wherein N is greater than 8.

16. A sample-and-hold device as claimed in claim 15 wherein the N successive sub-integration steps are divided at least substantially uniformly over one complete sampling interval.

* * * * *

UNITED STATES PATENT AND TRADEMARK OFFICE
CERTIFICATE OF CORRECTION

PATENT NO. : 5,081,372
DATED : January 14, 1992
INVENTOR(S) : Marcellinus J.M. Pelgrom It is certified that error appears in the above-indentified patent and that said Letters Patent is hereby corrected as shown below:

IN THE CLAIMS

Claim 4, line 1, delete "or";
line 2, delete "3".

Claim 7, line 2, change "corrected" to --connected--.

Signed and Sealed this

Fourth Day of January, 1994

*Attest:*

BRUCE LEHMAN

*Attesting Officer*  Commissioner of Patents and Trademarks